United States Patent [19]

Shim et al.

[11] Patent Number: 5,708,567
[45] Date of Patent: Jan. 13, 1998

[54] BALL GRID ARRAY SEMICONDUCTOR PACKAGE WITH RING-TYPE HEAT SINK

[75] Inventors: Il Kwon Shim, Seoul; Young Wook Heo, Kyungki-do, both of Rep. of Korea

[73] Assignees: Anam Industrial Co., Ltd., Seoul, Rep. of Korea; Amkor Electronics, Inc., Chandler, Ariz.

[21] Appl. No.: 748,937

[22] Filed: Nov. 13, 1996

[30] Foreign Application Priority Data

Nov. 15, 1995 [KR] Rep. of Korea ............... 95-41438

[51] Int. Cl.$^6$ ........................................ H05K 7/20
[52] U.S. Cl. ........................... 361/723; 257/675
[58] Field of Search ................... 165/80.2, 80.3, 165/185; 174/16.3; 257/669, 675, 707, 712–713; 361/704, 707, 715–723

[56] References Cited

U.S. PATENT DOCUMENTS

| | | | |
|---|---|---|---|
| 4,809,053 | 2/1989 | Kuraishi | 257/675 |
| 5,371,404 | 12/1994 | Juskey et al. | 361/704 |
| 5,442,234 | 8/1995 | Liang | 257/675 |
| 5,485,037 | 1/1996 | Marrs | 361/704 |
| 5,532,905 | 7/1996 | Moure | 361/723 |
| 5,586,007 | 12/1996 | Funada | 361/720 |
| 5,598,321 | 1/1997 | Mostafazadeh et al. | 361/718 |

*Primary Examiner*—Gregory D. Thompson
*Attorney, Agent, or Firm*—Skjerven, Morrill, MacPherson, Franklin & Friel LLP; Alan H. MacPherson; Thomas S. MacDonald

[57] ABSTRACT

A BGA (ball grid array) semiconductor package with a ring-type heat sink is disclosed. In the above package, the heat dissipating area is enlarged by extending the edge of a chip mounting die paddle formed of a copper or copper alloy layer to the outside of the package. The ring-type heat sink is attached to the extended portion of the die paddle such that the heat sink surrounds the encapsulant of the package. The above BGA package thus directly and effectively dissipates the chip's heat through the heat sink with high thermal conductivity. A plurality of plated through holes may be formed on the chip mounting portion of the PCB of the above package. The BGA package with both the ring-type heat sink and the PTHs, the heat dissipating effect of the package is further improved.

8 Claims, 3 Drawing Sheets

BALL GRID ARRAY SEMICONDUCTOR PACKAGE WITH RING-TYPE HEAT SINK

BACKGROUND OF THE INVENTION

1. Field of the Invention

The present invention relates in general to BGA (ball grid array) semiconductor packages with improved heat dissipation and, more particularly, to a structural improvement in such packages for enlarging the heat dissipating area and thereby effectively dissipating heat generated from a semiconductor chip during the operation of the package. The above structural improvement is achieved by extending the edge of a chip mounting die paddle, formed of a copper or copper alloy layer, to the outside of the package and by mounting a ring-type heat sink to the top surface of the extended portion of the above die paddle.

2. Description of the Prior Art

In a typical BGA (ball grid array) semiconductor package, at least one semiconductor chip is mounted to the top surface of a PCB (printed circuit board). The electrical contact between the package and conductive materials such as another printed circuit board is achieved by a plurality of solder balls arrayed on the bottom surface of the chip mounting PCB.

Recently, such BGA semiconductor packages have been widely used as semiconductor devices in multi-pin devices, such as devices having at least 200 pins, VLSIs (very large-scale integrated circuits) and microprocessors. However, such semiconductor devices must be provided with high speed signal transmission performance, so the devices must effectively dissipate heat generated from the chip during the operation of the package. When the above semiconductor devices fail to effectively dissipate heat during the operation of the package, the devices may cause operational error and/or reduce the intrinsic performance of the chip thereby causing a serious problem during the operation.

A typical BGA semiconductor package is shown in FIG. 1. As shown in the drawing, the semiconductor chip 30 of the typical BGA package 1' is mounted to the top surface of a PCB 20 by thermal conductive resin 33 such as silver containing epoxy. The above package 1' also includes a solder ball array which comprises a plurality of solder balls 40 welded to the bottom surface of the above PCB 20. A plurality of PTHs (plated through holes) 23 are vertically formed on a chip mounting portion of the PCB 20. As well known to those skilled in the art, heat is generated from the semiconductor chip 30 during the operation of the package 1'. In the above package 1', heat generated from the chip 30 ordinarily passes through the chip's bottom surface, the thermal conductive resin 33, the PTHs 23 of the PCB's chip mounting portion and the solder balls 40 thereby being dissipated outside the package 1'.

However, the above BGA package 1' has the following problem. That is, since the heat of the chip 30 passes through the chip's bottom surface, the thermal conductive resin 33, the PTHs 23 and the solder balls 40 which are made of different materials with different heat resistances, the above package 1' fails to achieve effective heat dissipation. Furthermore, multi-pin BGA semiconductor packages with an increased number of solder balls have recently been widely used in order to achieve the recent trend of high speed signal transmission. Such multi-pin BGA semiconductor packages must have an improved structure suitable for more effectively dissipating the chip's heat during the operation of the package. Therefore, BGA semiconductor packages with improved heat dissipation have been actively studied. The inventors of this invention have studied to provide a BGA semiconductor package with improved heat dissipation on the basis of a theory that about 60–70% of the chip's heat is dissipated through the chip's bottom surface.

SUMMARY OF THE INVENTION

It is, therefore, an object of the present invention to provide a structurally improved BGA semiconductor package in which the above problems can be overcome and which enlarges the heat dissipating area of the chip's bottom surface by extending the edge of a chip mounting die paddle, formed of a copper or copper alloy layer, to the outside of the package and by mounting a ring-type heat sink, surrounding the encapsulant of the package, to the top surface of the extended portion of the above die paddle, thereby directly and effectively dissipating the chip's heat through the heat sink with high thermal conductivity.

In order to achieve the above object, a BGA semiconductor package in accordance with a preferred embodiment of the present invention comprises a semiconductor chip mounted on one side of a printed circuit board (PCB); the PCB having a chip mounting die paddle, the edge of the die paddle being partially extended to the edge of the package in order to form an extended portion exposed outside the package; a wire electrically connecting a bond pad of the chip to an electrical conductive trace of the PCB; an encapsulant encapsulating the chip and wire in order to protect the chip and wire from surroundings; a ring-type heat sink attached to the extended portion of the die paddle and surrounding the encapsulant; and a plurality of solder balls welded to the other side of the PCB and used as input and output terminals of the package.

BRIEF DESCRIPTION OF THE DRAWINGS

The above and other objects, features and other advantages of the present invention will be more clearly understood from the following detailed description taken in conjunction with the accompanying drawings, in which:

FIGS. 3a and 3b are views showing the construction of a PCB (printed circuit board) used in the BGA semiconductor package of the present invention, in which:

FIG. 3a is a plan view of the PCB; and

FIG. 3b is a sectional view of the PCB taken along the section line 3B—3B of FIG. 3a;

FIGS. 4a and 4b are views showing the construction of a PCB in accordance with another embodiment of the present invention, in which:

FIG. 4a is a plan view of the PCB; and

FIG. 4b is a sectional view of the PCB taken along the section line 4B—4B of FIG. 4a;

DESCRIPTION OF THE PREFERRED EMBODIMENTS

Figure 1:
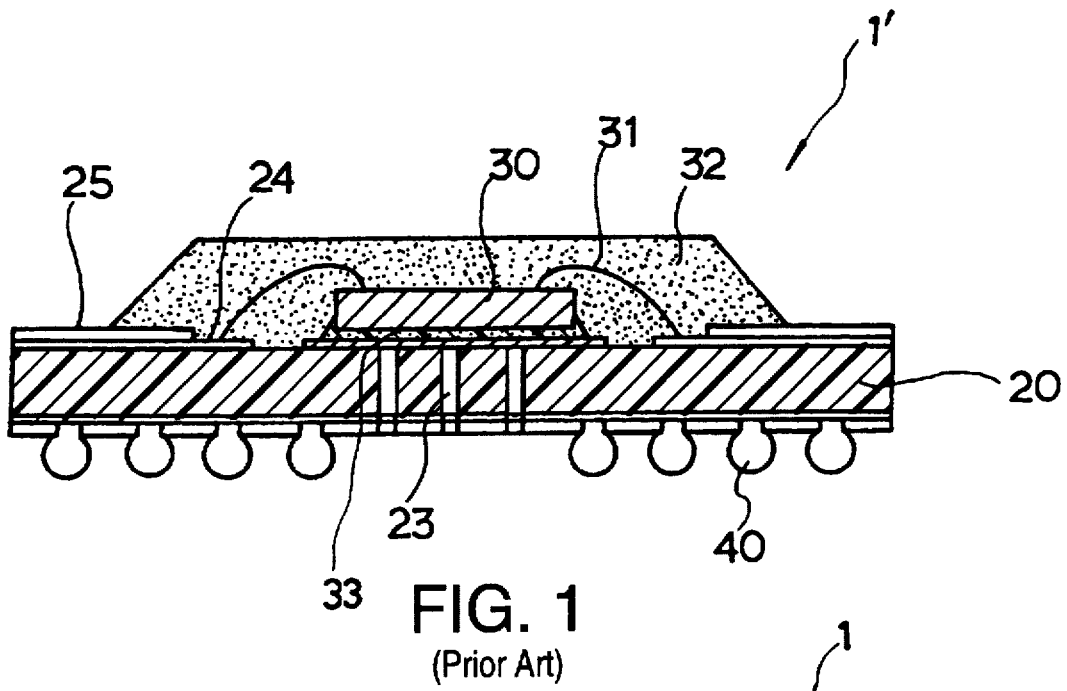
FIG. 1 is a sectional view showing the construction of a typical BGA semiconductor package.
Figure 2:
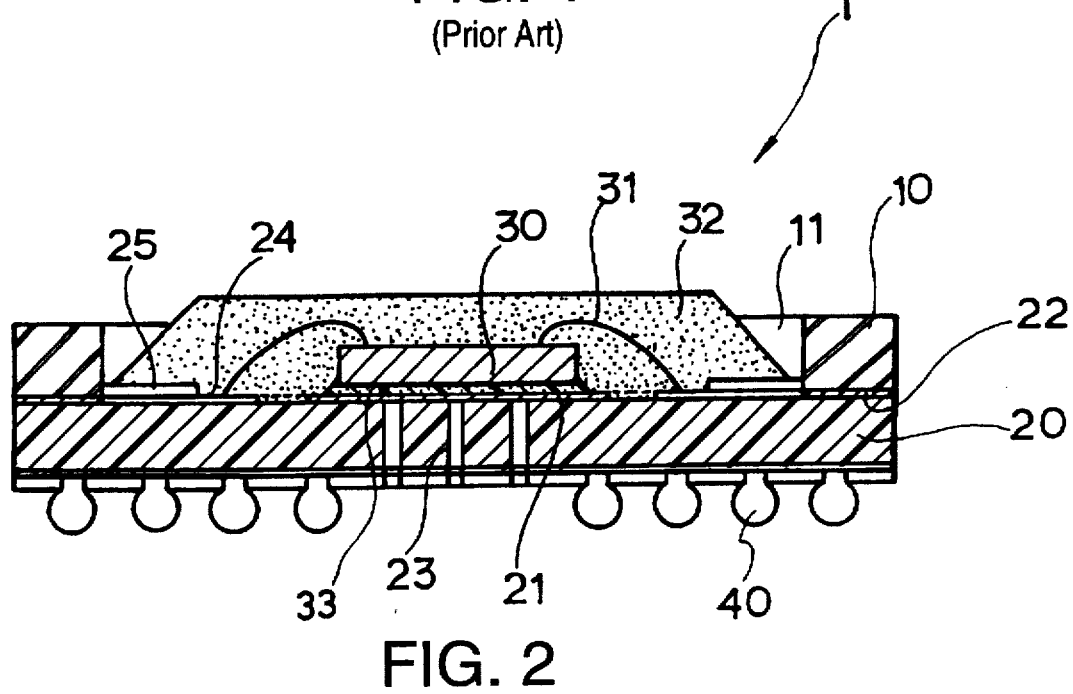
FIG. 2 is a sectional view showing the construction of a BGA semiconductor package in accordance with a preferred embodiment of the present invention.

FIG. 2 is a sectional view showing the construction of the BGA semiconductor package 1 in accordance with a preferred embodiment of the present invention.

In the above package 1, the semiconductor chip 30 is mounted to the top surface of a chip mounting die paddle 21 of a PCB 20. The die paddle 21 is formed on either side of the PCB 20. In the embodiment of FIG. 2, the die paddle 21 is formed on the top side of the PCB 20. Each side of the above PCB 20 is coated with copper or copper alloy layer. The semiconductor chip 30 is mounted to the PCB 20 using high thermal conductive resin 33 such as silver containing epoxy. of course, it should be understood that the PCB 20 may be substituted with another conventional circuit board. In the present invention, the above PCB 20 is preferably formed of bismaleimide triazine.

The electrical contact between the semiconductor chip 30 and PCB 20 is achieved by wire bonding. That is, a plurality of bond pads (not shown) of the chip 30 are electrically connected to the electrical conductive trace 24 of the PCB 20 through a plurality of wires 31. The above trace is formed on the PCB 20.

In the above package 1, the semiconductor chip 30, wires 31 and selective peripheral elements (not shown) are encapsulated by an encapsulant 32 formed of encapsulating compound, for example, epoxy resin, thereby being protected from bad surroundings such as moisture, dust, external shock and vibration. The above resin encapsulant 32 also relieves stress and strain caused by the relatively larger difference of thermal coefficient between the PCB 20 and chip 30. The encapsulant 32 has another operation function in that it uniformly distributes stress and strain, which are concentrated to the corners of the chip 30, to the chip 30 thoroughly.

A plurality of solder balls 40 are welded to the bottom side of the PCB 20 thereby forming a solder ball array. The above solder balls 40 act as input and output terminals of the package 1.

The above package 1 includes a ring-type heat sink 10 which surrounds the encapsulant 32. In the above preferred embodiment, the heat sink 10 has a generally rectangular configuration. However, it should be understood that there exist various different heat sink configurations which yield the same result as that of the above-described rectangular configuration without affecting the functioning of this invention.

In accordance with the above preferred embodiment of this invention, a plurality of conventional PTHs (plated through holes) 23 are formed on the chip mounting portion of the PCB 20 in addition to the above ring-type heat sink 10. In accordance with another embodiment of this invention, the BGA semiconductor package may be not provided with any PTH. The BGA semiconductor package with both the heat sink 10 and PTHs 23 has further improved heat dissipating effect in comparison with the BGA package of this invention with no PTH.

Figure 3A:
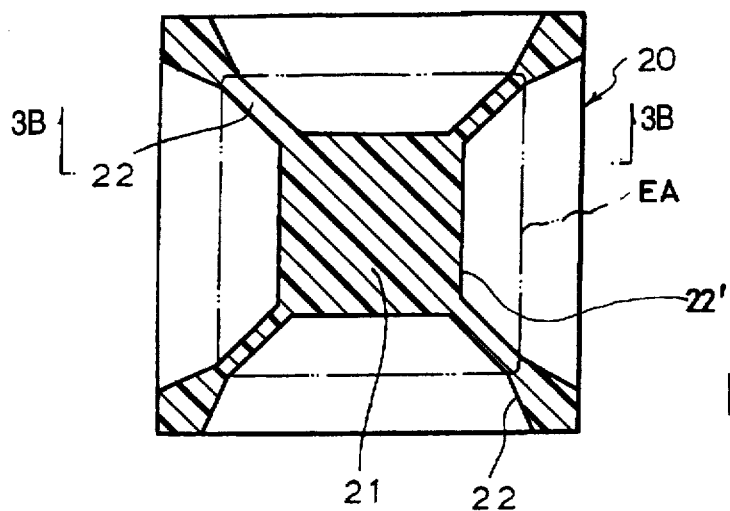
Figure 3B:
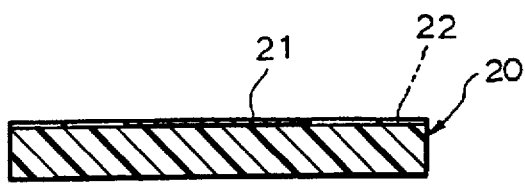
Figure 4A:
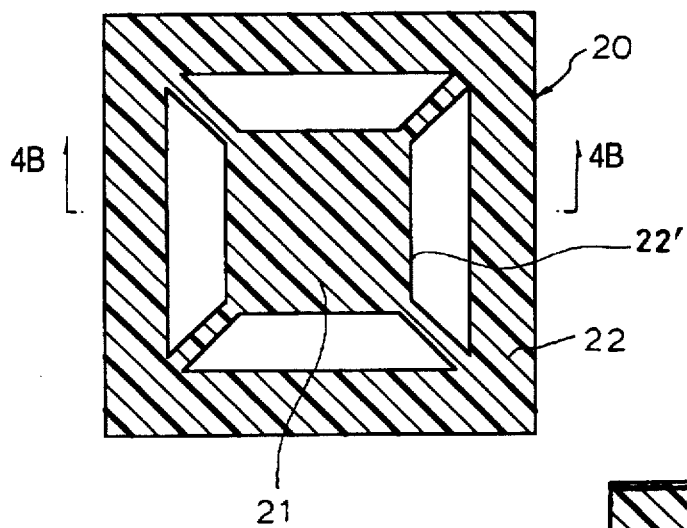
Figure 4B:
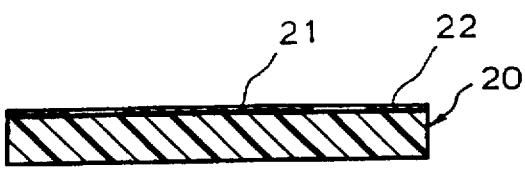

FIGS. 3a and 3b show the construction of a PCB 20 according to an embodiment of this invention, while FIGS. 4a and 4b show the construction of a PCB 20 according to another embodiment of this invention.

Referring first to FIGS. 3a and 3b, FIG. 3a is a plan view of the PCB 20 according to the one embodiment, while FIG. 3b is a sectional view of the PCB 20 taken along the section line 3B—3B of FIG. 3a.

In the embodiment of FIGS. 3a and 3b, the edge 22' of the chip mounting die paddle 21 is partially extended to the edge portion of the package thereby forming a plurality of extended portions 22. That is, the corners of the paddle 21 are extended to the corners of the package thereby forming the extended portions 22 of the paddle 21. When considering the package producing process, it is preferable to form the extended portions 22 by extending the corners of the paddle 21 to the corners of the package. However, it should be understood that there exist various different positions and configurations of the extended portions of the paddle 21 which yield the same result as that of the above portions 22 formed on the corners of the package. The ring-type heat sink 10 is mounted to the extended portions 22 of the paddle 21 such that the sink 10 surrounds the encapsulant 32. The above heat sink 10 enlarges the heat dissipating area of the package as will be described later herein. The above die paddle 21 and its extended portions 22 are formed of copper or copper alloy layer having a good heat transfer rate. In addition, it is preferable to plate the top surfaces of the extended portions 22 with nickel or Ni/Au alloy in order to improve the bonding force of the portions 22 relative to the heat sink 10. In FIG. 3a, the area (EA) inside the dash and dot is the encapsulating area which will be encapsulated with encapsulating compound to form the encapsulant 32.

FIG. 3b shows the die paddle 21 and its extended portions 22 deposited on the PCB 20. The height of the die paddle 21 and its extended portions 22 is lower than that of a solder mask 25 of FIG. 2.

Referring next to FIGS. 4a and 4b, FIG. 4a is a plan view of the PCB 20 according to the other embodiment, while FIG. 4b is a sectional view of the PCB 20 taken along the section line 4B—4B of FIG. 4a.

In the embodiment of FIGS. 4a and 4b, the edge of the chip mounting die paddle 21 is partially extended to the edge of the package. That is, the paddle's corners are extended to the edge of the package thereby forming an integrated extended portion 22 covering all of the edge portion of the package. The heat dissipating effect of the package according to this embodiment is maximized.

FIG. 4b shows the die paddle 21 and its extended portions 22 deposited on the PCB 20.

Figure 5:
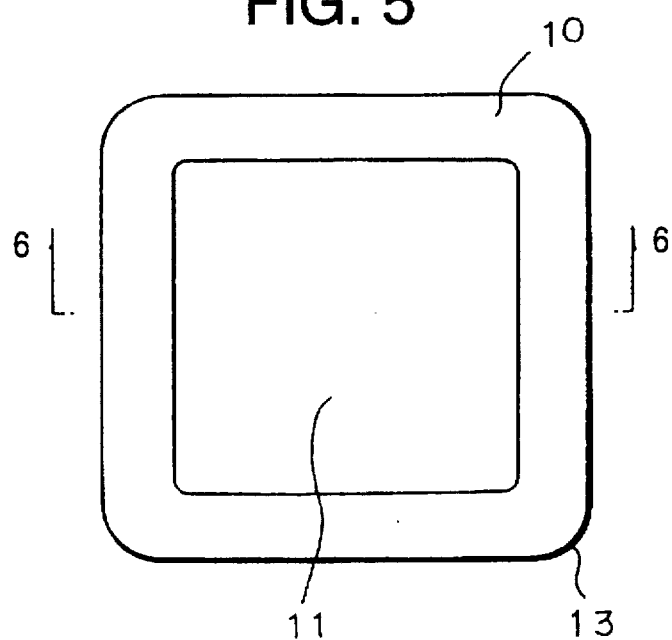
FIG. 5 is a plan view showing the construction of a ring-type heat sink used in the BGA semiconductor package of the present invention.
Figure 6:
FIG. 6 is a sectional view of the heat sink taken along the section line 6—6 of FIG. 5.
Figure 7:
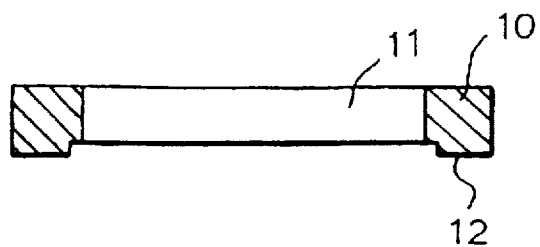
FIG. 7 is a sectional showing the construction of a ring-type heat sink in accordance with another embodiment of the present invention.

FIGS. 5 and 6 show the ring-type heat sink 10 according to an embodiment of this invention, while FIG. 7 shows the ring-type heat sink 10 according to another embodiment of this invention. As shown in FIGS. 5 to 7, the heat sink 10 is mounted to the extended portion 22 of the die paddle 21 such that the heat sink 10 surrounds the encapsulant 32 outside the package. The above heat sink 10 has a central opening 11. The opening 11 is larger than the encapsulant 32, so the heat sink 10 is prevented from coming into direct contact with the encapsulant 32 which is formed of encapsulating compound. When the heat sink 10 is brought into direct contact with the encapsulant 32, the stress and strain caused by the difference of thermal coefficient between the heat sink 10 and encapsulant 32 may be increased to cause an operational error in the package. The bonding surface or bottom surface of the heat sink 10 may be a flat surface as shown in FIG. 6. Alternatively, the bonding surface of the heat sink 10 may be partially embossed in order to form embossments 12 as shown in FIG. 7. The heat sink 10 of FIG. 7 is mounted to the paddle's extended portions 22 of FIG. 3a at the embossments 12.

In order to maximize the heat dissipating effect of the heat sink 10, the heat sink 10 is preferably formed of a metal such as copper, copper alloy, aluminum or stainless steel. In addition, it is preferable to round the corners 13 of the heat sink 10 in order to relieve the stress concentration on the corners as shown in FIG. 5. In the present invention, the radius of curvature of the each rounded corner 13 is not less than 40 mil.

The above heat sink 10 may be attached to the extended portion 22 of the die paddle 21 using epoxy or bonding tape having good thermal conductivity. Alternatively, the heat sink 10 may be attached to the extended portion 22 of the die paddle 21 through intermetallic welding. As a further alternative, the heat sink 10 may be attached to the extended portion 22 of the die paddle 21 through soldering with an Sn/Pb containing solder. In the case of use of the above solder, the bonding strength between the heat sink 10 and extended portion 22 is further increased.

In addition, the heat sink 10 may be anodized to form a thin film on the heat sink's surface in order to protect the heat sink's surface. Alternatively, the surface of the heat sink 10 may be treated with nickel or chrome.

In the BGA package of this invention, the edge of the chip mounting die paddle 21 formed of copper or copper alloy is partially extended to the edge of the package in order to form the extended portion 22. The heat sink 10 is attached to the top surface of the above extended portion 22 of the die paddle 21 and exposed outside the package. With the above construction of the BGA package, heat generated from the chip 30 is effectively transferred to the heat sink 10 through the die paddle 21 and its extended portion 22 exposed outside the package, thereby being effectively dissipated to surroundings from the heat sink 10. That is, the heat of the chip 30 in the BGA package of this invention is effectively dissipated to surroundings through the totally-exposed heat sink 10.

Particularly, the BGA package with both the heat sink 10 and PTHs 23 according to the preferred embodiment of this invention further improves the heat dissipating effect.

As described above, the present invention provides a BGA semiconductor package with a ring-type heat sink. Since the heat sink is totally exposed outside the encapsulant of the package, heat generated from the chip is effectively dissipated outside the package. In the present invention, a plurality of plated through holes (PTH) may be formed on the chip mounting portion of the PCB. In the case of the BGA package with both the ring-type heat sink and the PTHs, the heat dissipating effect of the package is further improved. The BGA package of this invention improves the operational performance and lengthens the expected life span of the package. Another advantage of the above BGA package is resided in that the package prevents operational error while the semiconductor chip is being operated.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A ball grid array (BGA) semiconductor package comprising:

a semiconductor chip mounted on one side of a printed circuit board (PCB);

the PCB having a chip mounting die paddle, said die paddle having extended portion which extended from the edge of said die paddle to the edge of the package in order to form an extended portion exposed outside the package;

a wire electrically connecting a bond pad of said chip to an electrical conductive trace of the PCB;

an encapsulant encapsulating said chip and wire in order to protect the chip and wire from surroundings;

a ring-type heat sink attached to the extended portion of said die paddle, and said heat sink surrounding said encapsulant; and a plurality of solder balls welded to the other side of said PCB and used as input and output terminals of the package.

2. The BGA semiconductor package according to claim 1, wherein at least one plated heat dissipating through hole is formed on a chip mounting portion of the PCB.

3. The BGA semiconductor package according to claim 1 or 2, wherein said die paddle and its extended portion are integrally formed of a copper or copper alloy layer having a good heat transfer rate.

4. The BGA semiconductor package according to claim 3, wherein the top surface of said extended portion of the die paddle is plated with nickel or nickel/gold alloy for improving the bonding force of the extended portion relative to the heat sink.

5. The BGA semiconductor package according to claim 1 or 2, wherein said heat sink has a central opening, said opening being larger than the encapsulant in order to prevent the heat sink from coming into direct contact with said encapsulant.

6. The BGA semiconductor package according to claim 5, wherein the corners of said heat sink are rounded in order to relieve stress concentration on said corners, each rounded corner of the heat sink having a radius of curvature being not less than 40 mil.

7. The BGA semiconductor package according to claim 1 or 2, wherein said heat sink is formed of a metal selected from the group of copper, copper alloy, aluminum and stainless steel and the surface of said heat sink is either anodized or treated with nickel or chrome.

8. The BGA semiconductor package according to claim 1 or 2, wherein said heat sink is attached to said extended portion of the die paddle by thermal conductive epoxy, bonding tape, intermetallic welding or soldering with an Sn/Pb containing solder.

* * * * *